(12) United States Patent
Parker et al.

(10) Patent No.: US 6,684,353 B1
(45) Date of Patent: Jan. 27, 2004

(54) RELIABILITY MONITOR FOR A MEMORY ARRAY

(75) Inventors: Allan Parker, Austin, TX (US); Joseph Skrovan, Buda, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 439 days.

(21) Appl. No.: 09/733,252

(22) Filed: Dec. 7, 2000

(51) Int. Cl.⁷ .............................................. G11C 29/00
(52) U.S. Cl. ..................................................... 714/718
(58) Field of Search ........................... 714/718, 5, 25, 714/710, 711; 365/201, 185

(56) References Cited

U.S. PATENT DOCUMENTS

| | | | |
|---|---|---|---|
| 4,748,627 A | * 5/1988 | Ohsawa | 714/764 |
| 5,233,614 A | * 8/1993 | Singh | 714/723 |
| 5,289,475 A | * 2/1994 | Slemmer | 714/718 |
| 5,434,868 A | * 7/1995 | Aichelmann, Jr. et al. | 714/718 |
| 5,909,334 A | 6/1999 | Barr et al. | 360/53 |
| 5,917,766 A | * 6/1999 | Tsuji et al. | 365/201 |
| 5,933,381 A | * 8/1999 | Iwata | 365/222 |
| 5,996,105 A | 11/1999 | Zook | 714/755 |
| 6,009,547 A | 12/1999 | Jaquette et al. | 714/758 |
| 6,021,477 A | 2/2000 | Mann | 711/167 |
| 6,052,815 A | 4/2000 | Zook | 714/758 |
| 6,079,044 A | 6/2000 | Cunningham et al. | 714/763 |
| 6,339,546 B1 | * 1/2002 | Katayama et al. | 365/185.09 |

* cited by examiner

*Primary Examiner*—Albert Decady
*Assistant Examiner*—Shelly A Chase

(57) ABSTRACT

An integrated reliability monitor that automatically tests a memory device until a threshold number of errors has been detected. The integrated reliability monitor eliminates the need for sophisticated external test equipment by automatically testing the memory cells in the memory array and providing the results. An optional programmable registers may store the error threshold value. The programmable registers may also store a time-out value or the reliability monitor may be externally interrupted.

38 Claims, 3 Drawing Sheets

RELIABILITY MONITOR FOR A MEMORY ARRAY

BACKGROUND

A memory cell may be a flash memory cell made of field effect transistors (FETs) that each include a select gate, a floating gate, a drain, and a source. Each memory cell may be read by grounding the source, and applying a voltage to a bitline connected with the drain. By applying a voltage to the wordline connected to the select gate, the cell can be switched "on" and "off." Each memory cell in an array of memory cells store a "1" or a "0. " Multi-level cells can store more than a single bit of data.

Programming a cell includes trapping excess electrons in the floating gate to increase the voltage. This reduces the current conducted by the memory cell when the select voltage is applied to the select gate. The memory cell is programmed when the cell current is less than a reference current and the select voltage is applied. The cell is erased when the cell current is greater than the reference current and the select voltage is applied.

A memory array may include multiple pages that are individually accessible. For example, a memory array may contain 64 pages and each page may contain 1 KB of memory cells. Each memory cell may be accessed by making the page that contains the memory cell the active memory page, then accessing the memory cell by selecting the row and column in the memory page that corresponds to the memory cell. The latency of making a memory page active is generally much larger than the access time of a memory cell. For example the page latency may be 3 microseconds while the cell access time may be only 50 nanoseconds.

A error may occur in a memory cell due to internal defects, normal use over a long period of time, non-use for a long period of time, or other factors. Two of the primary data reliability issues for memory cells are the "data retention" effect and "read disturb" effect. The "data retention" effect is a shift in the stored voltage level toward the erase state that results from the normal passage of time. The "read disturb" effect is a shift in the stored voltage level that results from reading the memory cell. For the read disturb effect to be appreciable, many reads must occur. When the stored voltage level shifts too far in either direction, it will be interpreted as representing the next higher or lower voltage level and thus the data will be misread.

An error checking and correction (ECC) circuit detects and optionally corrects errors in a memory array. An ECC circuit typically partitions a memory page into groups of memory cells and checks each group of memory cells independently and then generates a syndrome that indicates which memory cells had errors in each group. For example, a page of memory with 1 KB of memory cells may have 64 groups each containing 16 bytes of memory cells. Based on the algorithm of the ECC circuit and the size of the group, the memory cells in the group can be corrected if the total number of errors in the group is below a threshold. An ECC circuit typically generates a syndrome for each group that indicates which memory cells have errors. A syndrome that contains all zeros indicates that no errors were detected. If the number of errors in a group exceeds the threshold, none of the errors can be repaired. For example, the maximum number of errors that can be corrected in a memory array may be:

$$\text{Max \# of errors} = \text{\# of pages} * \text{\# of groups} * \text{bits/group} \quad \text{Eqn. 1}$$

Where:
Max # of errors is the maximum number of errors that can be corrected in the memory array.
# of pages is the number of pages in the memory array.
# of groups is the number of groups per page.
bits/group is the number of bits that can be repaired per group.
For the above example:

$$\text{Max \# of errors} = 64 * 64 * 16 \quad \text{Eqn. 2}$$
$$= 1\text{KB}$$

The reliability of a memory array is dependent on many factors, some of which are process-dependent. Therefore, it is desirable to periodically test memory arrays to ensure that the manufacturing processes is functioning properly. Currently, complex and expensive test equipment must be connected with the memory array to test the reliability of the memory array. Also, the external test equipment typically cause delays during testing. These delays significantly lengthen the testing period for tests such as "read disturb" tests.

BRIEF SUMMARY

An integrated reliability monitor automatically tests a memory device until a threshold number of errors are detected. The integrated reliability monitor eliminates the need for sophisticated external test equipment by automatically testing the memory cells in the memory array and providing the results. Optional programmable registers may store the error threshold value. The programmable registers may also store a time-out value or the reliability monitor may be externally interrupted.

BRIEF DESCRIPTION OF THE DRAWINGS

The present invention is described with reference to the accompanying figures. In the figures, like reference numbers indicate identical or functionally similar elements. Additionally, the left-most digit(s) of a reference number identifies the figure in which the reference number first appears.

DETAILED DESCRIPTION

In order to reduce the complexity of external test equipment and speed up memory testing, it is desirable to have an integrated mechanism to automatically test a memory array. Certain memory tests require a large number of iterations to complete. Such tests are best performed by an integrated and automated test controller. An example of such a test is a "read disturb" test that tests how many times a memory array can be read before an error is detected. Alternatively, the "read disturb" test may be executed until a threshold number of errors are detected. For example, the error threshold may be 1, 2, 4, 8, 16, 64, or some other value. Alternatively, the error threshold may be a percentage of the memory array, such as 1 % or the error threshold can be dynamic and vary over time. The error threshold may decrease over time to zero and thus act as a timeout mechanism. A write-read test repeatedly writes and reads the memory array until the number of detected errors reaches or exceeds an error threshold. Other tests may also be used to test the memory array.

Figure 1:
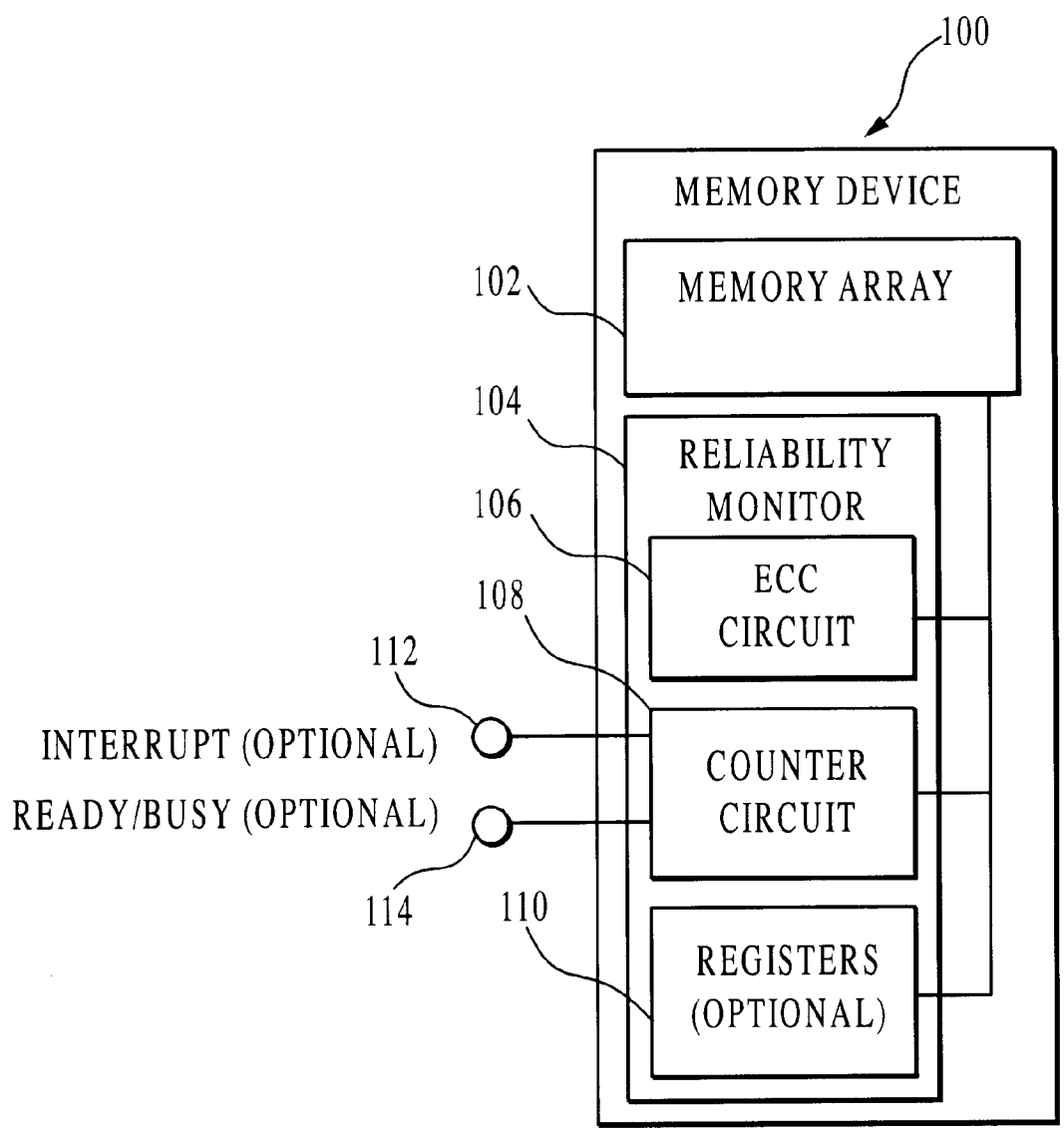
FIG. 1 is a block diagram of a memory device that includes a reliability monitor.

FIG. 1 is a block diagram of a memory device 100 that includes a memory array 102 and a reliability monitor 104. The memory array 102 may include flash memory cells, DRAM memory cells, SRAM memory cells, or other types of memory cells. In one embodiment, the memory array 102 includes pages of memory cells.

The reliability monitor 104 is an integrated and automated test controller that may include an ECC circuit 106, a counter circuit 108 and optional registers 110. The ECC circuit 106 checks the memory array for errors and optionally repairs any detected error. The ECC circuit 106 may operate autonomously or under the control of the counter circuit 108. The ECC circuit 106 preferably checks the memory array 102 on a group-by-group basis where the memory array 102 is divided into memory pages that are subdivided into groups. The ECC circuit 102 may use one or more error detection methods to determine if an error has occurred. For example, a cyclic redundancy check (CRC) using a Reed-Solomon algorithm may be used. The ECC circuit 106 may test a single group of memory or all the groups in page or the entire memory array 102. In one embodiment, the entire memory array 102 is tested sequentially one group at a time. Alternative, the entire memory array 102 can be tested following a non-sequential pattern such as a random or pseudorandom pattern. Other testing patterns can also be used such as testing each group sequentially but running the test several times on each group before proceeding to the next test. Once an error is detected, that memory cell or group can optionally be omitted from subsequent testing. Such a test determines the number of cycles before the error threshold is reached due to errors in different memory cells. This test may require a more sophisticated testing algorithm and consequentially may be slower. Other variations and combinations of such tests may also be used to test the memory array 102.

The counter circuit 108 counts the number of errors detected by the ECC circuit 106. Optionally, the number of errors may be stored in one of the registers 110. The counter circuit 108 may control the ECC circuit 106 such that the counter circuit 108 All begins and ends the memory testing. The counter circuit 108 may compare the number of errors counted to an error threshold stored in one of the registers 110. In another embodiment, the counter circuit 108 is configured with the error threshold built-in. Alternatively, the counter circuit 108 may be integrated with the ECC circuit 106.

The reliability monitor 104 may have various external interfaces, for example, "Interrupt" and "Ready/Busy" signals are received at interface nodes 112 and 114, respectively. In one embodiment, the interfaces nodes 112 and 114 are connected with the counter circuit 108. The Ready/Busy signal, also called the "Ready" signal, is an output signal transmitted at interface node 114. The reliability monitor 104 can lower the Ready/Busy signal to indicate a test is in progress then raise the signal once the test has terminated. In an embodiment that includes such a Ready/Busy signal, the Ready/Busy signal may be used to measure the duration of the test. It is preferred that the length of the test is a known constant value, such that the number of cycles completed in the test can be calculates by Eqn. 3.

Cycles=Test Duration/Test Length            Eqn. 3

The optional Interrupt signal is received at interface nodes 112 and interrupts the reliability monitor 104 during a memory test. The Interrupt signal can be used as a timeout mechanism to stop a memory test that has not detected enough errors to automatically terminate. In another embodiment, the Interrupt and Ready/Busy signals are received and transmitted at a single interface node. A timeout mechanism can be used in conjunction with or in place of the Interrupt signal. The timeout mechanism would terminate the testing after a timeout threshold is reached.

Figure 2:
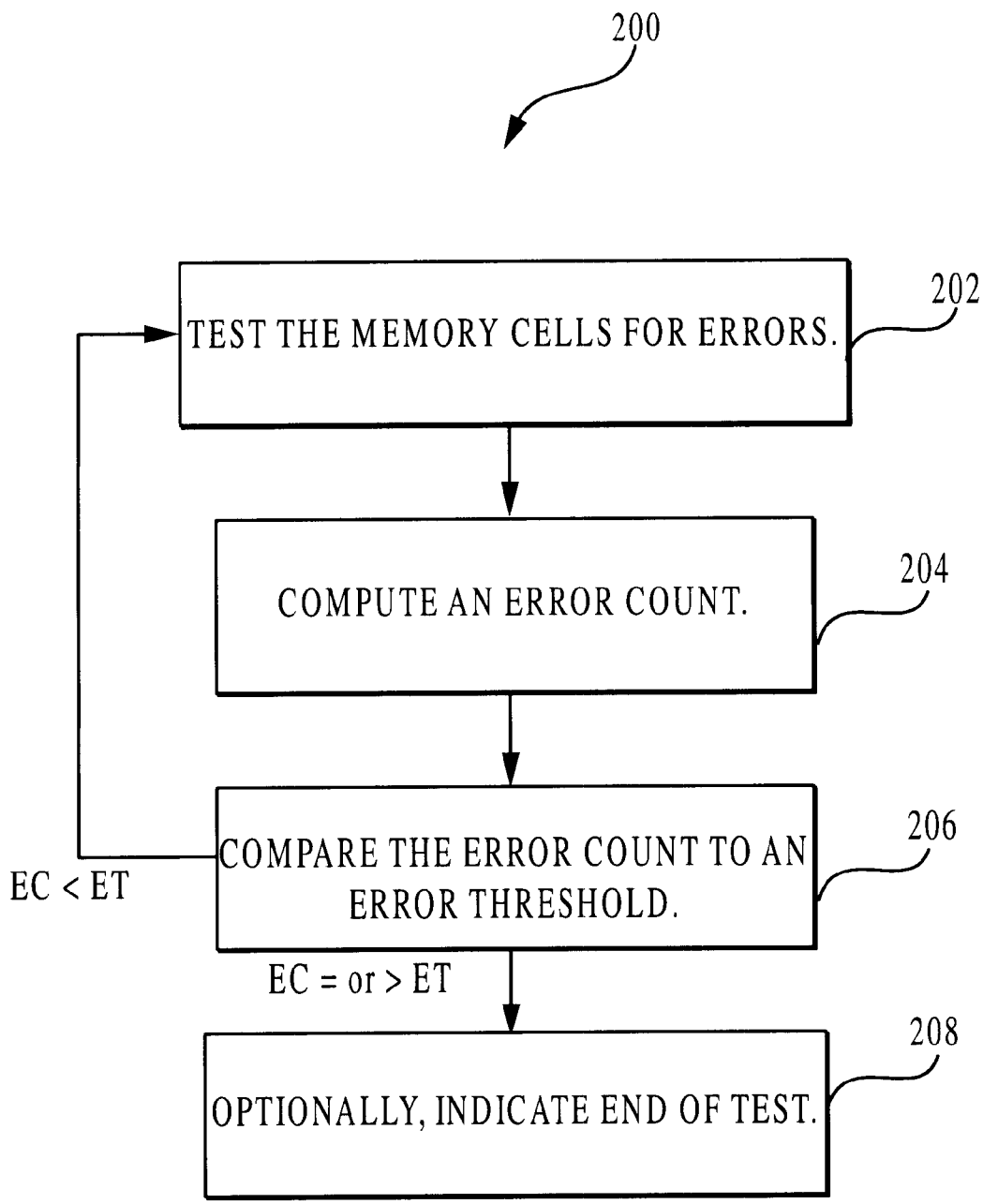
FIG. 2 is a flow diagram of a method of testing a memory device.

FIG. 2 is a flow diagram of a method 200 of testing a memory device. In 202, the memory cells in a memory array are tested for errors. One such test is the read disturb test that is performed sequentially across the entire memory array. The testing may be performed by an ECC circuit. Optionally, the errors detected are corrected.

In 204, the number of errors detected are counted. Since the cells are normally tested in groups, the number of errors detected can increase by one or more for each group tested.

In 206, the number of errors detected is compared to the error threshold. If the number of errors is less than the error threshold then the testing continues. If the number of errors is equal to or greater than the error threshold then the testing is terminated.

In 208, an indication that the test has ended is optionally transmitted. Alternatively, the length of the test in time or cycle count can be stored in a register for later access by external test equipment.

Figure 3:
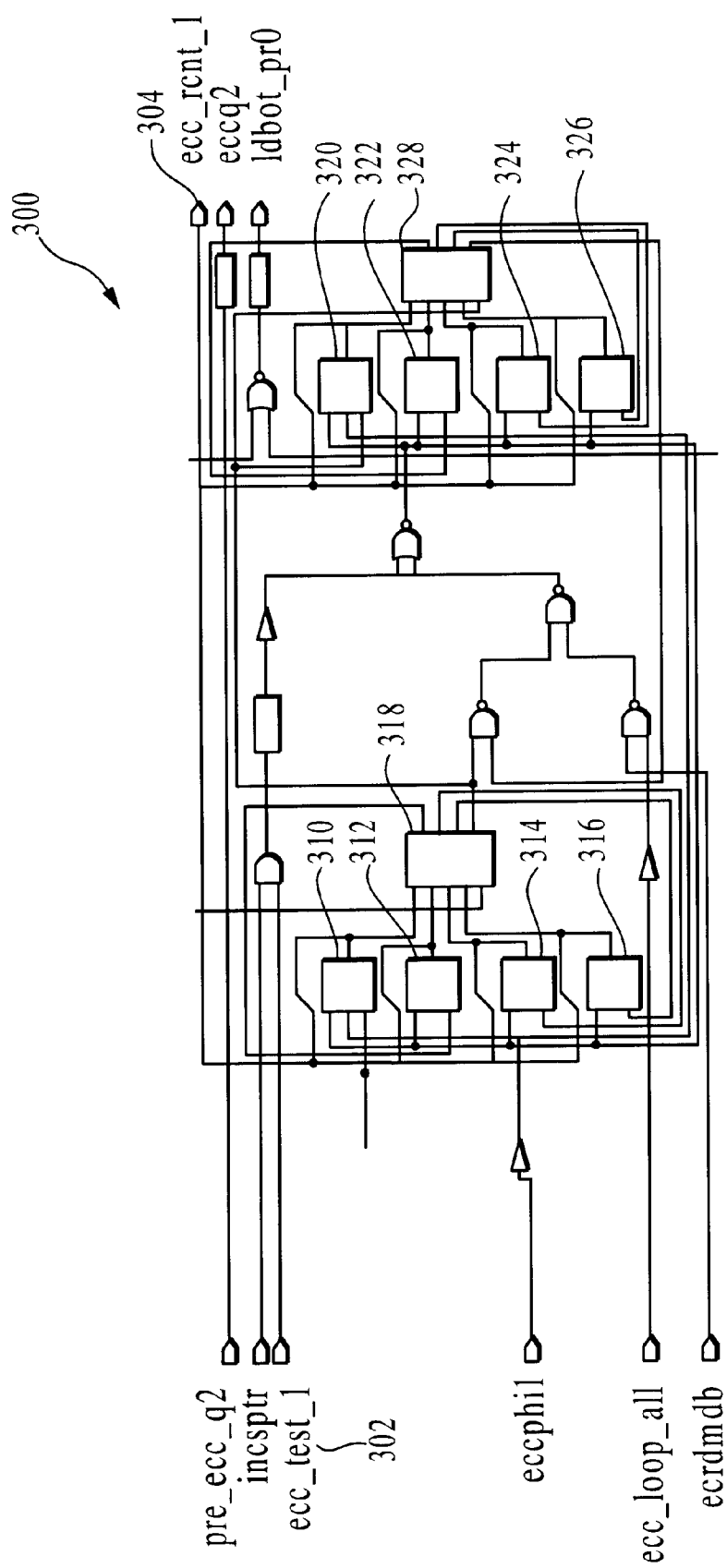
FIG. 3 is a circuit diagram of the reliability monitor.

FIG. 3 is a circuit diagram of an embodiment of an ECC error counter 300. An error signal indicating an error has been detected is received at the input node 302 and the counter output is transmitted from output node 304. The ECC error counter 300 may include four registers 310–316 connected with a look ahead circuit 318. A second set of four registers 320–326 are connected to a second look ahead circuit 328. The ECC error counter 300 may be implemented in Verilog as follows:

```
assign ecc_err = incsptr & ecc_test_1
noglitch_ecc noglitch_1(ecc_err_ng, ecc_err);
assign eck = ((ecc_err_ng) & !(e4t0 & e8t0)) & (!ecrdmdb | ecc_loop_all);
    ecnibtgen4 lookahead0 (e1t, e2t, e3t, e4t0, ecc_rcnt_1[0],
ecc_rnt_1[1], ecc_rcnt_1[2], ecc_rcnt_1[3], 1'b1);
    ecntreg areg_0 (ecc_rcnt_1[0], eck, !eccphi1, 1'b1);
    ecntreg areg_1 (ecc_rcnt_1[1], eck, !eccphi1, e1t);
    ecntreg areg_2 (ecc_rcnt_1[2], eck, !eccphi1, e2t);
    ecntreg areg_3 (ecc_rcnt_1[3], eck, !eccphi1, e3t);
    ecnibtgen4 lookahead1 (e5t, e6t, e7t, e8t0, ecc_rcnt_1[4],
ecc_rnt_1[5], ecc_rcnt_1[6], ecc_rcnt_1[7], e4t0);
    ecntreg areg_4 (ecc_rcnt_1[4], eck, !eccphi1, e4t);
    ecntreg areg_5 (ecc_rcnt_1[5], eck, !eccphi1, e5t);
    ecntreg areg_6 (ecc_rcnt_1[6], eck, !eccphi1, e6t);
    ecntreg areg_7 (ecc_rcnt_1[7], eck, !eccphi1, e7t);
    Where:
    "ecc_test_1" indicates ECC repair in test mode.
    "eccphil" resets the error counter.
    "incsptr" is the syndrome increment used with self test ECC repairs.
```

While preferred embodiments have been shown and described, it will be understood that they are not intended to limit the disclosure, but rather it is intended to cover all modifications and alternative methods and apparatuses falling within the spirit and scope of the invention as defined in the appended claims or their equivalents.

What is claimed is:

1. A method of testing a memory device having groups of memory cells, comprising:

testing a first group of memory cells for errors with an integrated automated test controller comprising an ECC module;

computing an error count to an error threshold; and repeating the testing, computing, and comparing when the error count is less than the error threshold.

2. The method of claim 1, wherein the testing, computing, and comparing are performed by an integrated reliability monitor.

3. The method of claim 2, wherein the testing, computing, comparing, and repeating are performed autonomously once initiated.

4. The method of claim 2, further comprising computing a cycle count representing a number of cycles executed during the cycling.

5. The method of claim 2, further comprising providing an external indication of a beginning and an end of the testing, computing, comparing, and repeating such that a cycle count representing a number of cycles executed can be calculated based on a duration of the testing.

6. The method of claim 2, wherein the comparing comprises comparing the error count to an error threshold that is less than 33.

7. The method of claim 6, wherein the comparing comprises comparing the error count to an error threshold that is less than one.

8. The method of claim 2, wherein the threshold is time dependent.

9. The method of claim 2, wherein the comparing comprises comparing the error count to an error threshold that is a percentage of the first block of memory.

10. The method of claim 9, wherein the comparing comprises comparing the error count to an error threshold that is programmable and is stored in the memory device.

11. The method of claim 10, wherein the comparing comprises comparing the error count to an error threshold that is stored in non-volatile memory.

12. The method of claim 10, wherein the testing comprises correcting the errors.

13. The method of claim 10, further comprises providing a cycle count.

14. The method of claim 10, wherein the testing comprises performing read operations sequentially on each memory cell in the first group of memory.

15. The method of claim 10, wherein the testing comprises performing read and write operations on each memory cell in the first group of memory.

16. The method of claim 2, further comprising testing, computing and comparing a second group of memory cells after the first group and the error count indicates a number of errors detected during testing of the first and second groups.

17. The method of claim 16, wherein the memory device comprises flash memory cells.

18. The method of claim 2, wherein the testing further comprises indicating when a first error is detected and when the error count reaches the error threshold.

19. The method of claim 2, wherein the testing further comprises omitting a memory cell from subsequent testing once an error is detected in the memory cell.

20. The method of claim 2, wherein the comparing further comprises comparing a timer value to a timeout value and the repeating comprises repeating the testing, computing and comparing when the error count is less than the error threshold and the timer value is less than the timeout value.

21. The method of claim 2, wherein the comparing further comprises monitoring an interrupt signal and the repeating comprises repeating the testing, computing and comparing when the error count is less than the error threshold and the interrupt signal is off.

22. A reliability monitor circuit for testing a memory array, comprising:

an integrated automated test controller comprising an ECC circuit, that tests the memory array for errors; and a counter circuit that initiates the ECC circuit to repeatedly test the memory array, counts the errors detected by the ECC circuit, and stops the ECC circuit when the errors reach an error threshold.

23. The circuit of claim 22 further comprising:

a programmable threshold register that stores the error threshold.

24. The circuit of claim 23 further comprising:

an error count register that stores a number of errors counted by the counter circuit.

25. The circuit of claim 22, wherein the counter circuit further comprises a cycle counter that calculates a cycle count representing a number of times the ECC circuit tested the memory array.

26. The circuit of claim 22, further comprising:

a ready line, wherein the counter circuit toggles a signal on the ready line when the ECC circuit is initiated and stopped.

27. The circuit of claim 26, wherein the memory array is tested at a substantially constant rate such that an external cycle counter can calculate a cycle count based on the ready signal.

28. The circuit of claim 22, wherein the error threshold is one.

29. The circuit of claim 22, wherein the error threshold is less than 33.

30. The circuit of claim 22, wherein the error threshold is a percentage of the memory array.

31. The circuit of claim 22, wherein the ECC circuit tests the memory array by performing a read operation sequentially on each memory cell of the memory array.

32. The circuit of claim 22, wherein the ECC circuit tests the memory array by performing read operations on each memory cell of the memory array in a pseudorandom pattern.

33. The circuit of claim 22, wherein the ECC circuit tests the memory array by performing read and write operations on each memory cell in the first group of memory.

34. The circuit of claim 22, wherein the counter circuit also stops the ECC circuit when the ECC circuit has operated for longer than a timeout value.

35. The circuit of claim 22, further comprising an interrupt line connected with the counter circuit, wherein the counter circuit stops the ECC circuit when the interrupt line is toggled.

36. The circuit of claim 22, wherein the memory array comprises flash memory cells.

37. The circuit of claim 22, wherein the ECC circuit tests only the memory cells that are error free.

38. The circuit of claim 22, wherein the error threshold is time dependent.

* * * * *